United States Patent
Kim et al.

(10) Patent No.: US 10,027,441 B2
(45) Date of Patent: Jul. 17, 2018

(54) METHOD AND APPARATUS FOR DECODING DATA IN RECEIVER THAT USES NON-BINARY LOW DENSITY PARITY CHECK CODE

(71) Applicant: Samsung Electronics Co., Ltd., Gyeonggi-do (KR)

(72) Inventors: Sang-Min Kim, Gyeonggi-do (KR); Woo-Myoung Park, Gyeonggi-do (KR); Chi-Woo Lim, Gyeonggi-do (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/025,242

(22) PCT Filed: Sep. 25, 2014

(86) PCT No.: PCT/KR2014/008962
§ 371 (c)(1),
(2) Date: Mar. 25, 2016

(87) PCT Pub. No.: WO2015/046915
PCT Pub. Date: Apr. 2, 2015

(65) Prior Publication Data
US 2016/0233978 A1    Aug. 11, 2016

(30) Foreign Application Priority Data
Sep. 25, 2013 (KR) .................. 10-2013-0113658

(51) Int. Cl.
*H03D 1/00* (2006.01)
*H04L 27/06* (2006.01)
(Continued)

(52) U.S. Cl.
CPC ......... *H04L 1/005* (2013.01); *H03M 13/1171* (2013.01); *H03M 13/3707* (2013.01);
(Continued)

(58) Field of Classification Search
CPC ............. H04L 1/0054; H04L 25/03343; H04L 25/4927; H04L 25/4975; H04L 1/006;
(Continued)

(56) References Cited

U.S. PATENT DOCUMENTS 8,938,660 B1* 1/2015 Varnica ................. H03M 13/00
714/755
9,036,735 B1* 5/2015 Park ..................... H04B 1/0475
375/296
(Continued)

OTHER PUBLICATIONS

International Search Report dated Dec. 22, 2014 in connection with International Patent Application No. PCT/KR2014/008962; 3 pages.
(Continued)

*Primary Examiner* — James M Perez

(57) ABSTRACT

Provided is a method for receiving data in a receiver that performs decoding using a non-binary Low Density Parity Check (LDPC) code. The method includes generating a message vector for each symbol by demodulating received data; determining data characteristics and channel characteristics of the received data; determining the number of vector elements to be used for decoding among vector elements of the message vector using at least one of the data characteristics and the channel characteristics; and selecting vector elements according to the determined number of vector elements, and decoding the received data using the selected vector elements.

20 Claims, 7 Drawing Sheets

(51) Int. Cl.
    *H04L 1/00*          (2006.01)
    *H03M 13/11*       (2006.01)
    *H03M 13/37*       (2006.01)
    *H03M 13/00*       (2006.01)
    *H04L 1/18*         (2006.01)

(52) U.S. Cl.
    CPC ... *H03M 13/3723* (2013.01); *H03M 13/6577* (2013.01); *H04L 1/0003* (2013.01); *H04L 1/0026* (2013.01); *H04L 1/0057* (2013.01); *H04L 1/1812* (2013.01); *H04L 1/0009* (2013.01); *Y02D 50/10* (2018.01)

(58) Field of Classification Search
    CPC ... H04L 1/0065; H04L 1/0071; H04L 1/0041; G11B 20/10009; H03M 13/41; H03M 13/4107; H03M 13/6502; H03M 13/25; H04B 14/04
    USPC .................. 375/259–285, 316–352, 242–254
    See application file for complete search history.

(56) References Cited

U.S. PATENT DOCUMENTS

| | | | | |
|---|---|---|---|---|
| 9,042,472 | B2* | 5/2015 | Klimer | H04B 7/0854 375/267 |
| 9,208,018 | B1* | 12/2015 | Northcott | G06F 11/1008 |
| 9,319,069 | B2* | 4/2016 | Nemati Anaraki | H03M 13/1105 |
| 9,363,036 | B1* | 6/2016 | Zhang | H04L 1/0009 |
| 9,467,171 | B1* | 10/2016 | Varnica | H03M 13/2975 |
| 9,667,273 | B2* | 5/2017 | Kim | H03M 13/1171 |
| 9,692,451 | B2* | 6/2017 | Vasista Srinivasan Ranganathan | H03M 13/1171 |
| 2004/0109507 | A1* | 6/2004 | Kanter | H03M 13/1134 375/259 |
| 2004/0243917 | A1* | 12/2004 | Suh | H03M 13/1117 714/801 |
| 2004/0252791 | A1* | 12/2004 | Shen | G11B 20/1833 375/340 |
| 2006/0156163 | A1 | 7/2006 | Berens et al. | |
| 2007/0127589 | A1* | 6/2007 | Hwang | H04B 7/0848 375/267 |
| 2007/0226585 | A1* | 9/2007 | Park | H03M 13/1111 714/758 |
| 2008/0037676 | A1* | 2/2008 | Kyung | H04L 1/0003 375/265 |
| 2011/0096858 | A1* | 4/2011 | Klimer | H04B 7/0854 375/267 |
| 2011/0142181 | A1* | 6/2011 | Leshem | H04L 25/03318 375/341 |
| 2011/0252286 | A1 | 10/2011 | Li et al. | |
| 2011/0268063 | A1 | 11/2011 | Hammarwall et al. | |
| 2012/0066572 | A1* | 3/2012 | Lim | H04L 1/0072 714/807 |
| 2012/0233524 | A1 | 9/2012 | Varnica et al. | |
| 2013/0019141 | A1 | 1/2013 | Wang et al. | |
| 2013/0156133 | A1* | 6/2013 | Gentile | H03M 13/1111 375/340 |
| 2014/0153625 | A1* | 6/2014 | Vojcic | H04L 1/005 375/224 |
| 2014/0351671 | A1* | 11/2014 | Liu | H03M 13/1105 714/763 |
| 2015/0003499 | A1* | 1/2015 | Boutillon | H04L 27/2003 375/146 |
| 2015/0026536 | A1* | 1/2015 | Hubris | G06F 11/1048 714/758 |
| 2015/0092290 | A1* | 4/2015 | Liu | G11B 20/1833 360/47 |
| 2015/0263763 | A1* | 9/2015 | Kim | H03M 13/1171 714/752 |
| 2015/0280744 | A1* | 10/2015 | Kim | H04L 1/1607 714/776 |
| 2015/0295592 | A1* | 10/2015 | Ahn | H03M 13/1117 714/752 |
| 2015/0349801 | A1* | 12/2015 | Park | H03M 13/1171 714/752 |
| 2016/0336967 | A1* | 11/2016 | Boutillon | H03M 13/1117 |
| 2017/0149445 | A1* | 5/2017 | Liu | H03M 13/1111 |

OTHER PUBLICATIONS

Written Opinion of the International Searching Authority dated Dec. 22, 2014 in connection with International Patent Application No. PCT/KR2014/008962; 6 pages.

\* cited by examiner

[Fig. 1]
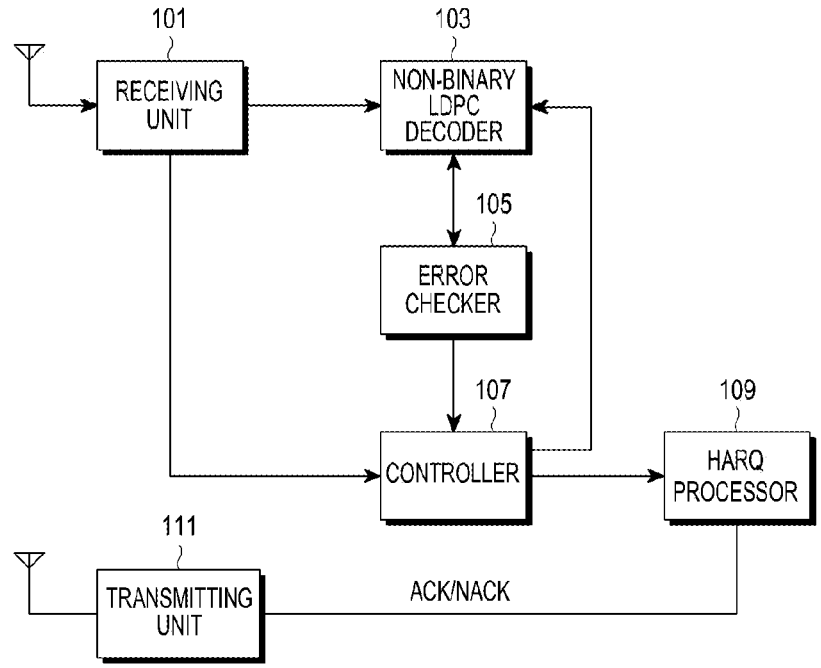
[Fig. 2]
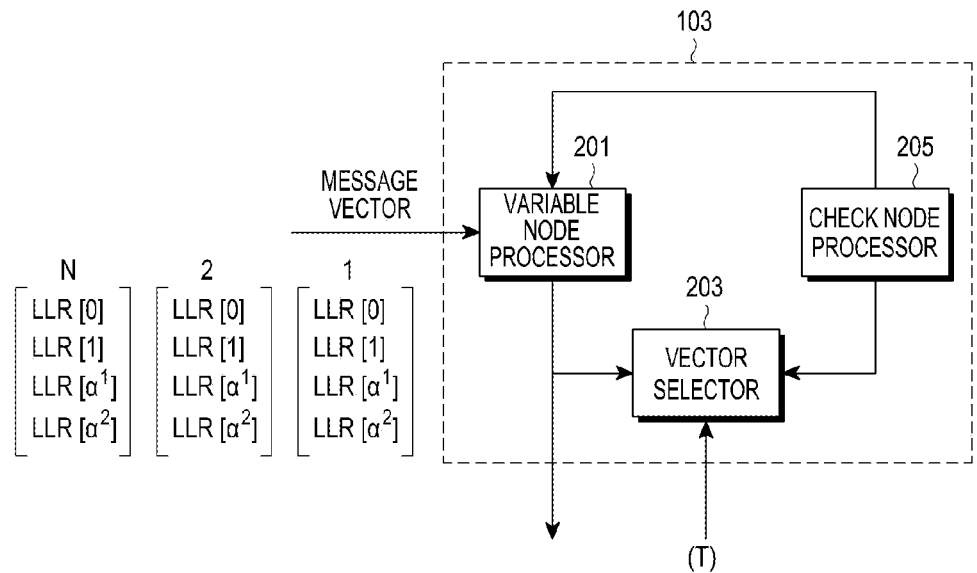

[Fig. 3]
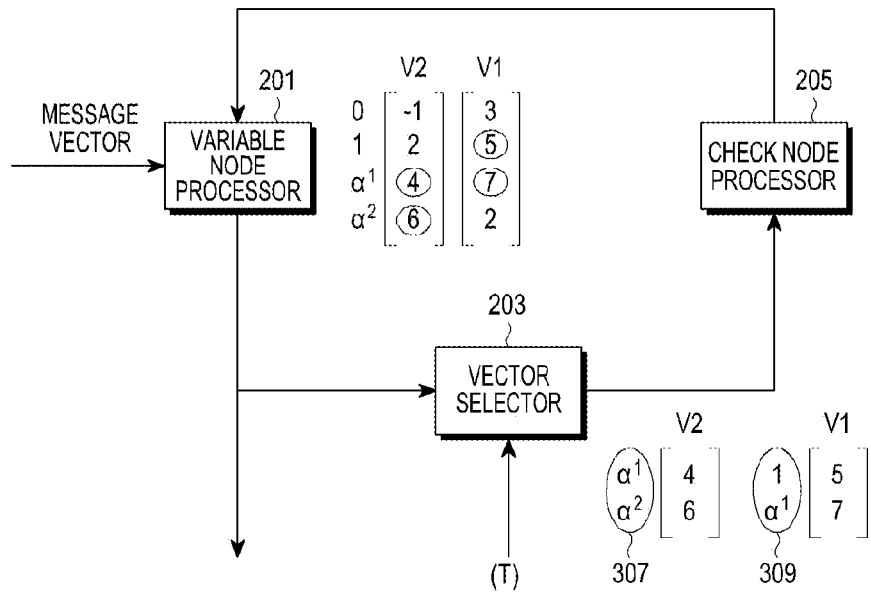
[Fig. 4]
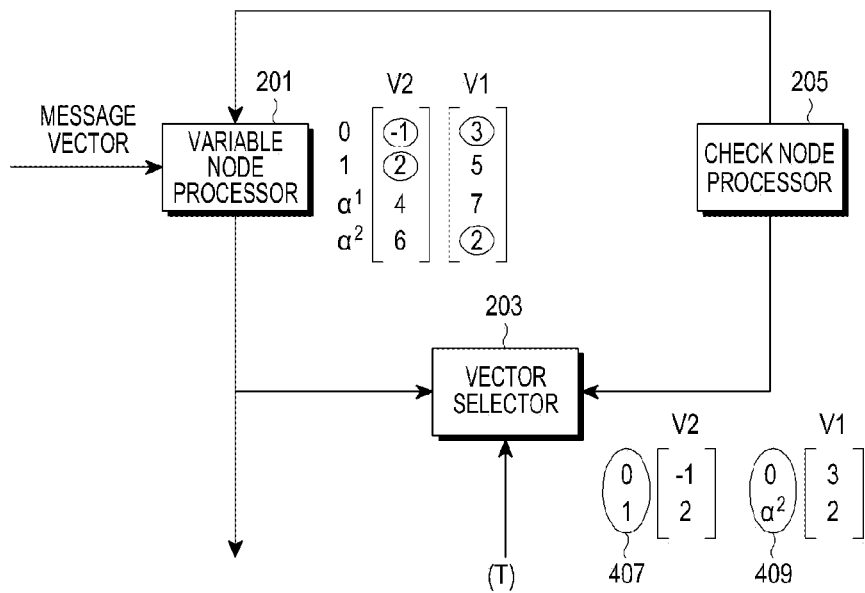

[Fig. 5]
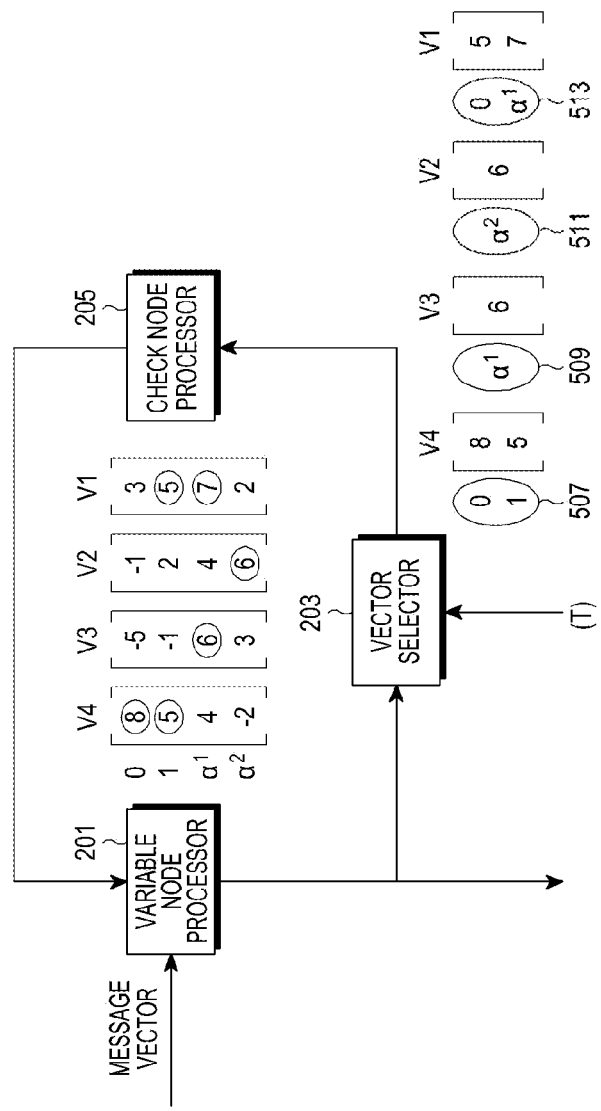

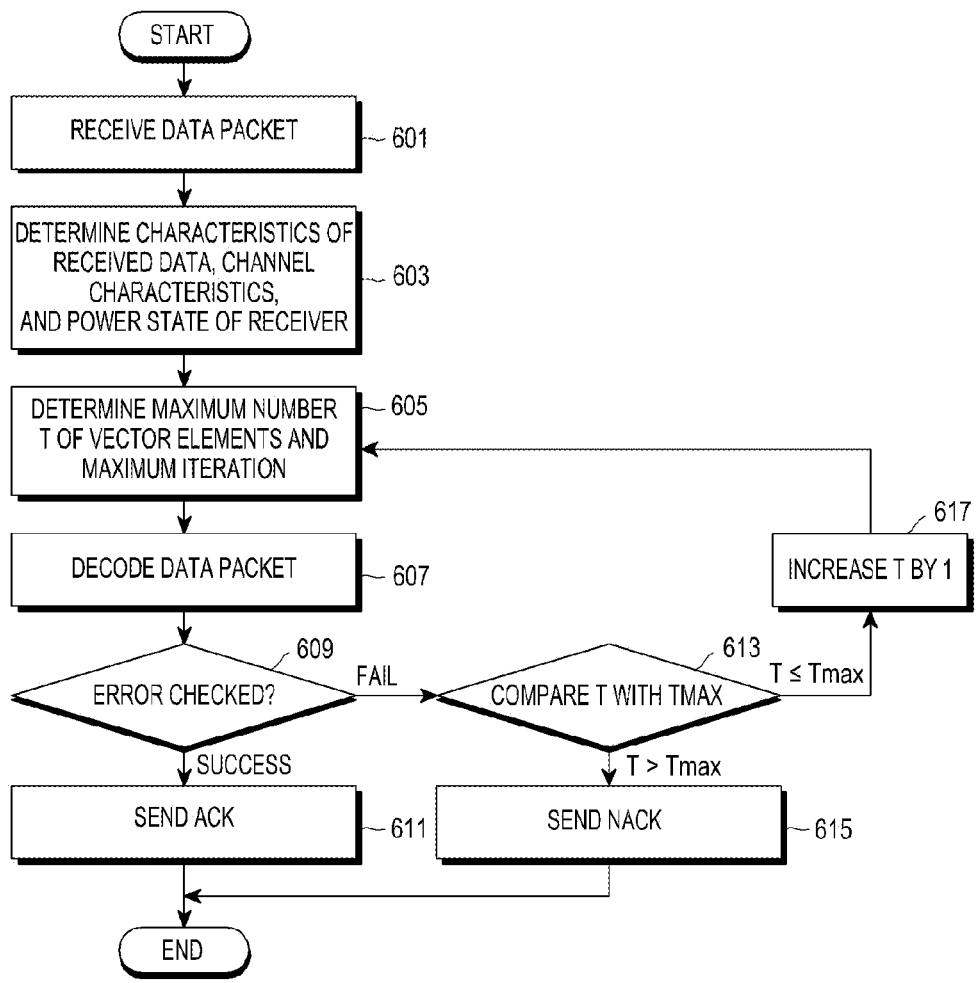
[Fig. 6]

[Fig. 7]
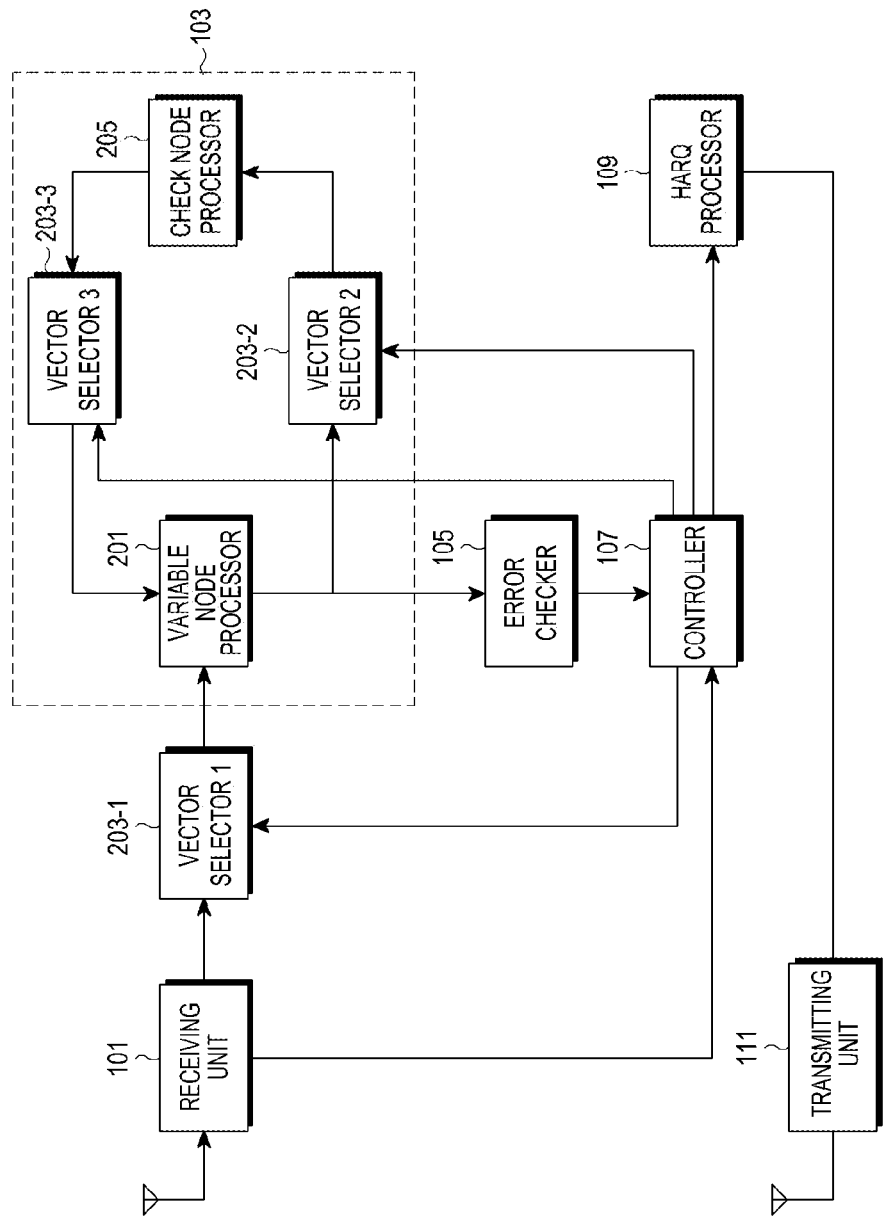

[Fig. 8]
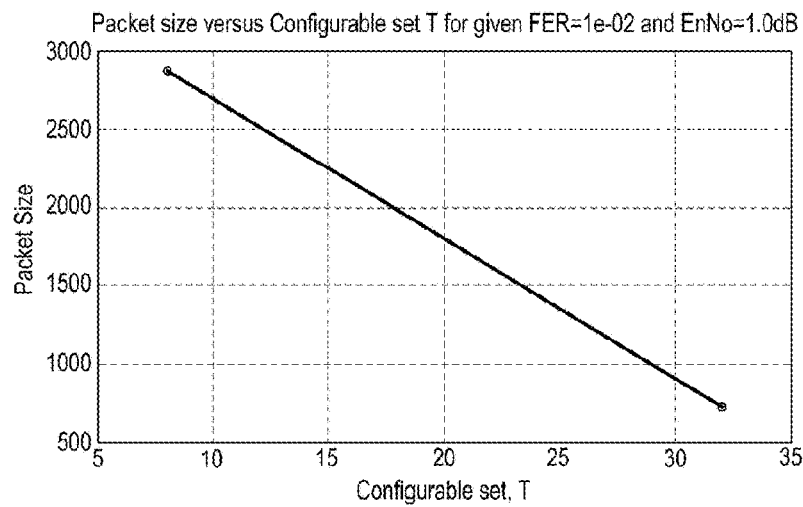
[Fig. 9]
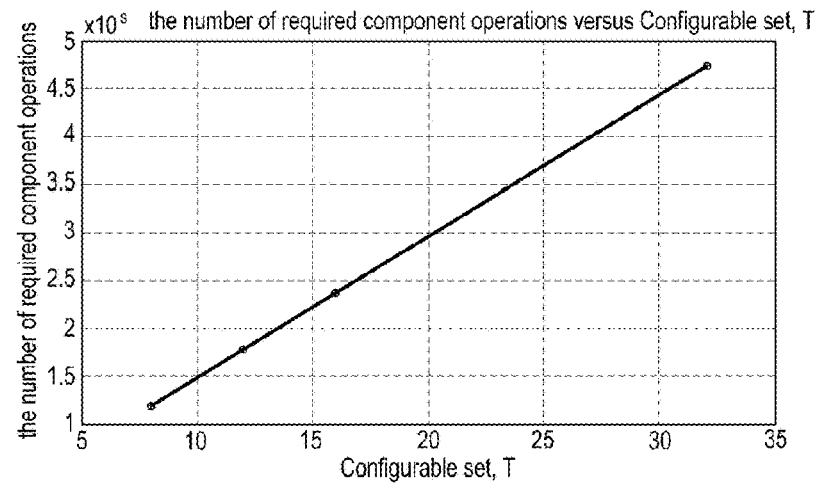
[Fig. 10]
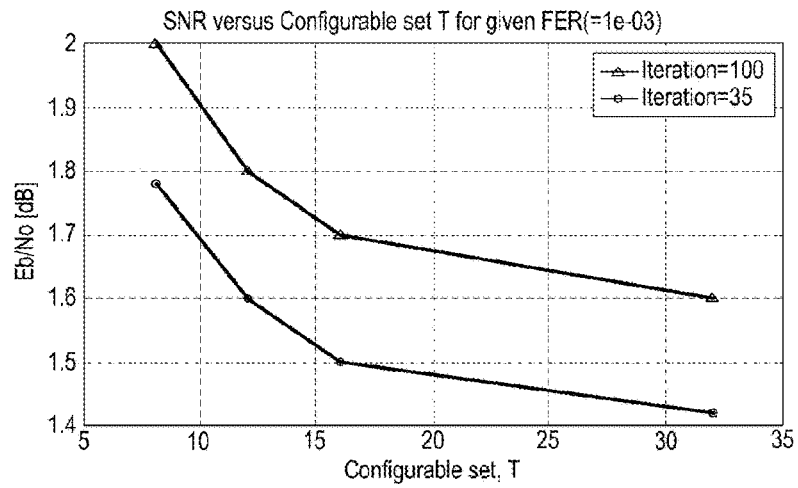

[Fig. 11]
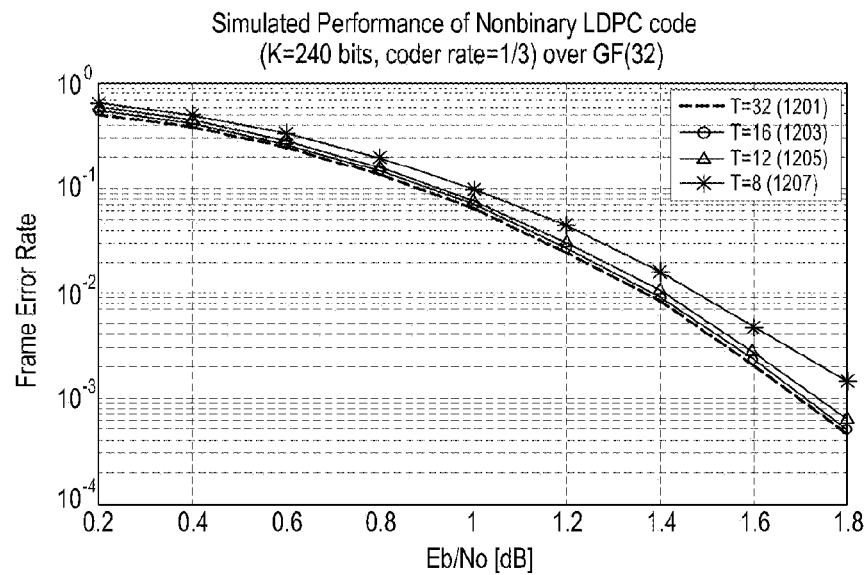
[Fig. 12]
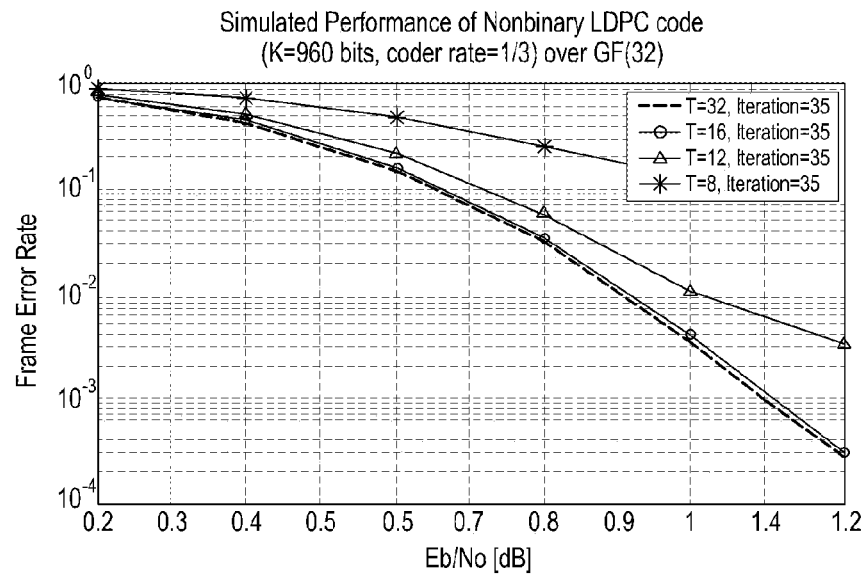

METHOD AND APPARATUS FOR DECODING DATA IN RECEIVER THAT USES NON-BINARY LOW DENSITY PARITY CHECK CODE

CROSS-REFERENCE TO RELATED APPLICATIONS AND CLAIM OF PRIORITY

The present application claims priority under 35 U.S.C. § 365 to International Patent Application No. PCT/KR2014/008962 filed Sep. 25, 2014, entitled "METHOD AND APPARATUS FOR DECODING DATA IN RECEIVER THAT USES NON-BINARY LOW DENSITY PARITY CHECK CODE", and, through International Patent Application No. PCT/KR2014/008962, to Korean Patent Application No. 10-2013-0113658 filed Sep. 25, 2013, each of which are incorporated herein by reference into the present disclosure as if fully set forth herein.

TECHNICAL FIELD

The present disclosure relates to a method and apparatus for decoding data in a receiver that uses a non-binary Low Density Parity Check (LDPC) code.

BACKGROUND ART

Due to the increasing demands for high-speed communication systems that can process not only the multimedia services consisting of a variety of information such as images and wireless data but also the early voice-oriented services, the recent mobile communication systems are required to increase the system efficiency using the channel coding technique suitable for the systems.

During transmission of data, inevitable errors may occur due to the noises, interference, fading and the like depending on the channel conditions, causing a loss of information. Generally, in order to reduce the loss of information, a variety of error control techniques are used depending on the characteristics of the channel, thereby increasing the system reliability. The most basic one of these error control techniques may be an error control technique that uses error correcting codes. A Low Density Parity Check (LDPC) code is one of the error correcting codes.

The LDPC code, which is a code proposed by Gallager, may be roughly classified into a binary LDPC code and a non-binary LDPC code. The binary LDPC code is defined by a binary parity check matrix of a sparse structure, in which a majority of elements constituting the matrix have a value of '0' and a minority of elements other than the elements having a value of '0' have a value of '1'. In other words, the elements constituting the binary parity check matrix have a value of '0' or '1'. A parity check matrix of the non-binary LDPC code, unlike that of the binary LDPC code, is made up of elements in a Galois Field $GF(q=2^p)$ (where q is an integer greater than 2). In the GF, p has a value of an integer greater than 1, and for p=1, the LDPC code is a binary LDPC code. For example, in GF(8), 8 symbols may be represented.

A relationship between the non-binary LDPC code and the binary LDPC code will be described in brief.

For example, in the case of the non-binary LDPC code, symbols of GF(4) may be represented as shown in Table 1 below.

TABLE 1

| 0 | 1 |
|---|---|
| 1 | 1 |

If Table 1 is read in the order of rows and represented in a line, the result can be '0111', which can be converted into a decimal value of '7'. Because of GF(4), if 7 is divided by 4, the remainder is 3 (=7 mod 4). Similarly, even if Table 1 is read in the order of columns and represented in a line, the result can be '0111', which can be converted into a decimal value of '7'. Thus, in GF(4), this value represents 3 (=7 mod 4). Therefore, Table 1 may represent a non-binary LDPC code value of 3. Based on this example, a non-binary LDPC code may be converted into a binary LDPC code. For example, Table 2 below shows an example of a non-binary LDPC code, and the non-binary LDPC code may be converted into a binary LDPC code as shown in Table 3 below.

TABLE 2

| 1 | 1 | 0 |
|---|---|---|
| 3 | 0 | 2 |

TABLE 3

| 1 | 0 | 1 | 0 | 0 | 0 |
|---|---|---|---|---|---|
| 0 | 1 | 0 | 1 | 0 | 0 |
| 0 | 1 | 0 | 0 | 1 | 1 |
| 1 | 1 | 0 | 0 | 1 | 0 |

In Table 3, if the underlined bold elements

| 1 | 0 |
|---|---|
| 0 | 1 | in the upper left are read in the order of rows and represented in a line, they can be represented as '1001', which can be converted into a decimal value of '9'. If the decimal value is converted into a value in GF(4), 9 mod 4=1. Therefore, If 1 in GF(4) is converted into a binary LDPC code, the result is

| 1 | 0 |
|---|---|
| 0 | 1 |

.

In other words, in the non-binary LDPC code in Table 2, if an element (=1) in the upper left is converted into a binary LDPC code, the result is

| 1 | 0 |
|---|---|
| 0 | 1 |

.

Other elements in Table 2 may also be converted in the same way, generating Table 3.

For example, a non-binary parity check matrix H configured in GF(4) may be expressed as Table 4 below.

TABLE 4

| 1 | 1 | 0 |
|---|---|---|
| 3 | 0 | 2 |

In Table 4, each element of the matrix may have 4 values, which mean the values defined in GF(4). For example, GF(4) may be defined as GF(4)={0, 1, 2, 3}, and the elements may be expressed as a non-binary parity check matrix as shown in Table 4. Generally, elements of GF($q=2^p$) may be presented in a minimum polynomial of $\alpha$. Therefore, elements of GF($q=2^p$) may be expressed as {0, 1, $\alpha$, . . . , $\alpha^{q-2}$}. If elements of a non-binary LDPC code are converted into elements of a binary LDPC code, they are converted in the form of a binary p-tuple ($a_0, a_1, \ldots, a_{p-1}$). For GF(4), based on a definition of the minimum polynomial of p(x)=1+x+x2, a GF(4)'s element of 0 may be expressed as a binary tuple (0, 0); a GF(4)'s element of 1 may be expressed as a binary tuple (0, 1); a GF(4)'s element of $\alpha$ may be expressed as a binary tuple (1, 0); and a GF(4)'s element of $\alpha^2$ may be expressed as a binary tuple (1, 1). Based on this example, a non-binary LDPC code may be converted into a binary LDPC code. For example, Table 5 below shows an example of a non-binary LDPC code, and the non-binary LDPC code may be converted into a binary LDPC code as shown in Table 6 below.

TABLE 5

| 1 | 1 | 0 |
|---|---|---|
| $\alpha^2$ | 0 | $\alpha$ |

TABLE 6

| 0 | 1 | 0 | 1 | 0 | 0 |
|---|---|---|---|---|---|
| 1 | 1 | 0 | 0 | 1 | 0 |

In Table 6, underlined bold elements <u>1</u>, <u>1</u> in the lower left constitute a binary LDPC code corresponding to $\alpha^2$ in GF(4).

This binary LDPC code may be converted into a non-binary LDPC code, and channel coding and decoding may be performed in units of symbols using the non-binary LDPC code. It is known that the non-binary LDPC code is much superior to the binary LDPC code in terms of the error correction capability because the non-binary LDPC code encodes and decodes the modulation cardinality and channel cardinality in the same unit.

When performing decoding using a non-binary LDPC code, a receiver may de-modulate received data, output a message vector for each received symbol, and provide the output to a decoder. The decoder may perform iterative decoding using some or all of the elements constituting the message vector. Conventionally, however, the number of vector elements of each vector, which are used for decoding, is fixed to the same value at all times regardless of the data characteristics or channel conditions. In this case, an unnecessarily large number of vector elements may be used for decoding, even though the channel conditions are good. Therefore, during decoding, computation may excessively increase, causing a waste of the power and time required during the decoding.

DISCLOSURE OF INVENTION

Technical Problem

The above information is presented as background information only to assist with an understanding of the present disclosure. No determination has been made, and no assertion is made, as to whether any of the above might be applicable as prior art with regard to the present disclosure.

Solution to Problem

An aspect of the present disclosure is to address at least the above-mentioned problems and/or disadvantages and to provide at least the advantages described below. Accordingly, an aspect of embodiments of the present disclosure is to provide a method and apparatus for adaptively adjusting the number of vector elements used for decoding, taking into account the data characteristics and channel conditions in a receiver that uses a non-binary LDPC code.

Another aspect of embodiments of the present disclosure is to provide a method and apparatus for adaptively adjusting the iteration (or the number of iterative decoding) taking into account the data characteristics and channel conditions in a receiver that uses a non-binary LDPC code.

Another aspect of embodiments of the present disclosure is to provide a method and apparatus for setting in advance the number of vector elements used for decoding and selecting the number of vector elements depending on the channel conditions in a receiver that uses a non-binary LDPC code.

Another aspect of embodiments of the present disclosure is to provide a method and apparatus for performing a Hybrid Automatic Repeat reQuest (HARQ) operation using the decoding results obtained based on the selected number of vector elements in a receiver that uses a non-binary LDPC code.

In accordance with an aspect of the present disclosure, there is provided a method for receiving data in a receiver that performs decoding using a non-binary Low Density Parity Check (LDPC) code. The method includes generating a message vector for each symbol by demodulating received data; determining data characteristics and channel characteristics of the received data; determining the number of vector elements to be used for decoding among vector elements of the message vector using at least one of the data characteristics and the channel characteristics; and selecting vector elements according to the determined number of vector elements, and decoding the received data using the selected vector elements.

The determining of the number of vector elements may include determining a maximum iteration using at least one of the data characteristics and the channel characteristics; determining a power state of the receiver; and determining the number of vector elements using at least one of the data characteristics, the channel characteristics, the maximum iteration, and the power state of the receiver.

The method may further include increasing the determined number of vector elements by a predetermined value, if there is an error in the decoded data and the determined number of vector elements is less than a predetermined threshold; and reselecting the vector elements according to the increased number of vector elements and decoding the received data using the reselected vector elements.

The method may further include: if there is an error in the decoded data and the determined number of vector elements is greater than or equal to a predetermined threshold, generating a decoding fail signal for the errored data; and generating and sending a Negative Acknowledgement (NACK) message for the errored data.

The selecting of the vector elements may include selecting the determined number of vector elements from among the vector elements of the message vector for each of the symbols.

The selecting of the vector elements may include selecting the determined number of vector elements from all vector elements of message vectors for N symbols constituting a codeword.

The determining of the number of vector elements may include determining the number of vector elements for a variable node output message while performing decoding using the LDPC code; and the selecting of the vector elements may include selecting the determined number of vector elements for the variable node output message from among vector elements of the variable node output message.

The determining of the number of vector elements may include determining the number of vector elements for a check node output message while performing decoding using the LDPC code; and the selecting of the vector elements may include selecting the determined number of vector elements for the check node output message from among vector elements of the check node output message.

The data characteristics may include at least one of a packet size, a modulation format, and a code rate of the received data. The method channel characteristics include at least one of a Signal-to-Interference plus Noise Ratio (SINR) and a Channel Quality Indicator (CQI).

In accordance with another aspect of the present disclosure, there is provided an apparatus for receiving data in a receiver that performs decoding using a non-binary LDPC code. The apparatus may include a receiving unit configured to generate a message vector for each symbol by demodulating received data; a controller configured to determine data characteristics and channel characteristics of the received data, and determine the number of vector elements to be used for decoding among vector elements of the message vector using at least one of the data characteristics and the channel characteristics; a vector selector configured to select vector elements according to the determined number of vector elements; and a decoder configured to decode the received data using the selected vector elements.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF DRAWINGS

The above and other aspects, features and advantages of certain exemplary embodiments of the present disclosure will be more apparent from the following description taken in conjunction with the accompanying drawings, in which:

FIG. 1 illustrates a receiver including a non-binary LDPC decoder 103 according to an embodiment of the present disclosure;

FIG. 2 illustrates a non-binary LDPC decoder 103 and message vector elements being input to the non-binary LDPC decoder 103 according to an embodiment of the present disclosure;

FIG. 3 illustrates an internal operation of a non-binary LDPC decoder 103 that has determined the number of vector elements to be used for decoding according to an embodiment of the present disclosure;

FIG. 4 illustrates an internal operation of a non-binary LDPC decoder 103 that has determined the number of vector elements to be used for decoding according to another embodiment of the present disclosure;

FIG. 5 illustrates an internal operation of a non-binary LDPC decoder 103 that has determined the number of vector elements to be used for decoding according to further another embodiment of the present disclosure;

FIG. 6 illustrates an operation of receiving and decoding data and performing an HARQ operation depending on the decoding results by a receiver according to embodiments of the present disclosure;

FIG. 7 illustrates a structure of a receiver according to another embodiment of the present disclosure;

FIG. 8 illustrates the number T of vector elements, which is determined depending on the packet size, which is an example of received-data characteristics, according to embodiments of the present disclosure;

FIG. 9 illustrates a relationship between the determined number T of vector elements and the computation required during decoding according to embodiments of the present disclosure.

FIG. 10 illustrates a relationship between a Signal to Noise Ratio (SNR), which is an example of channel characteristics, and the number T of vector elements according to an embodiment of the present disclosure;

FIG. 11 illustrates a relationship between a Frame Error Rate (FER) and an SNR for the changing number T of vector elements according to an embodiment of the present disclosure; and FIG. 12 illustrates a relationship between an FER and an SNR for the changing number T of vector elements at a constant iteration according to an embodiment of the present disclosure.

Throughout the drawings, like reference numerals will be understood to refer to like parts, components, and structures.

MODE FOR THE INVENTION

The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skilled in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of exemplary embodiments of the present disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The main concept of embodiments of the present disclosure described below is to select message vector elements to be used for decoding, taking into account the characteristics of received data, the channel conditions, the power state of the receiver, the iteration for iterative decoding, and the like, and to perform decoding using the selected vector elements, in a receiver that performs decoding using a non-binary LDPC code. In this way, the receiver may adaptively adjust the number of vector elements used during decoding, depending on the data characteristics and channel conditions, contributing to a decrease in the time and power required during the decoding.

Embodiments of the present disclosure will be described in detail below.

FIG. 1 illustrates a receiver including a non-binary LDPC decoder 103 according to an embodiment of the present disclosure.

A receiver 100 in FIG. 1 may include a receiving unit 101, a non-binary LDPC decoder 103, an error checker 105, a controller 107, an HARQ processor 109, and a transmitting unit 111.

The receiving unit 101 may receive and demodulate the signal transmitted by a transmitter, and provide the demodulated data to the non-binary LDPC decoder 103. The receiving unit 101 may obtain, from the demodulated signal, received-data characteristics (e.g., data packet size, modulation format, code rate, etc.) and channel characteristics (e.g., Signal-to-Interference plus Noise Ratio (SINR), Channel Quality Indicator (CQI), etc.) and provide the obtained information to the controller 107.

The controller 107 may determine the number T of vector elements to be used for decoding in the non-binary LDPC decoder 103, and the maximum iteration which is the maximum value during iterative decoding, taking into account at least one of the received-data characteristics and channel characteristics, which are provided from the receiving unit 101, and the current power state of the receiver. Thereafter, the controller 107 may provide the determined T value and maximum iteration to the non-binary LDPC decoder 103. The T value may be set within a range of the maximum value Tmax for the number of message vector elements. However, when determining the maximum iteration, the controller 107 may take the T value into consideration. On the contrary, when determining the T value, the controller 107 may take the maximum iteration into consideration. The message vector, the T value and the Tmax value will be described in detail later on.

The non-binary LDPC decoder 103 may decode the data received from the receiving unit 101, using the number T of message vector elements and the maximum iteration, which are provided from the controller 107, and output the decoded data to the error checker 105. An operation of the non-binary LDPC decoder 103 according to an embodiment of the present disclosure will be described in detail below with reference to FIG. 2 and its subsequent drawings.

The error checker 105 may check an error using the output of the non-binary LDPC decoder 103, and provide the error check results to the controller 107. It is common for the error checker 105 to perform error checking using Cyclic Redundancy Check (CRC), but the error checking is not limited thereto. Although the error checker 105 may be implemented as a component of the non-binary LDPC decoder 103, the error checker 105 is illustrated as a separate component in this specification for convenience. A detailed operation of the error checker 105 will be described below.

In an embodiment of the present disclosure, the non-binary LDPC decoder 103 uses the interactive decoding scheme, and if there is an error in the results of one iterative decoding performed in the non-binary LDPC decoder 103, the non-binary LDPC decoder 103 may perform iterative decoding once again. The iterative decoding may last until its iteration reaches the maximum iteration that is set in advance by the controller 107.

If there is no error in the decoded signal after the iterative decoding has been performed within the range of the maximum iteration, the error checker 105 may send a signal indicating a success in the decoding to the controller 107. The controller 107 may instruct the HARQ processor 109 to send an Acknowledgement (ACK), in response to the decoding success signal, and the HARQ processor 109 may send an ACK through the transmitting unit 111.

On the other hand, if there is an error in the decoded signal even though the iterative decoding has been performed until its iteration reaches the maximum iteration, the error checker 105 may send a signal indicating a fail in the decoding to the controller 107. In response to the decoding fail signal, the controller 107 may compare the number T of message vector elements, which is currently set, with the maximum value Tmax for the number of message vector elements. If the T value is less than the Tmax value, the controller 107 may increase the T value, send the increased T value to the non-binary LDPC decoder 103, allowing the non-binary LDPC decoder 103 to perform again iterative decoding according to the increased T value. Although the controller 107 may usually increase the T value one by one, the controller 107 may increase the T value not on a one-by-one basis, but on an N-by-N basis where N is a predetermined value other than 1, depending on the setting of the controller 107. The operation of the controller 107, for increasing the T value, may last until T=Tmax.

A structure of the non-binary LDPC decoder 103 will now be described.

FIG. 2 illustrates a non-binary LDPC decoder 103 and message vector elements being input to the non-binary LDPC decoder 103 according to an embodiment of the present disclosure.

The non-binary LDPC decoder 103 may include a variable node processor 201, a vector selector 203 and a check node processor 205.

As described in FIG. 1, the receiving unit 101 may receive and demodulate a signal transmitted by a transmitter, and provide the demodulated signal to the non-binary LDPC decoder 103. The receiving unit 101 may receive and demodulate the data transmitted by the transmitter, in units of symbols, and output the demodulated data. The output of the receiving unit 101 is a 'message vector'. The message vector means a set of probability or possibility for the symbol values that a received symbol can have. The probability value may be usually expressed as a Log Likelihood Ratio (LLR) value.

For example, if the transmitter performs encoding using a non-binary LDPC code, and then performs modulation using Quadrature Phase Shift Keying (QPSK), a symbol received at the receiver may have 4 values because QPSK is a modulation scheme of expressing two bits as one symbol. The receiving unit 101 may output LLR values for 4 possible values for one received symbol, and in the present disclosure, a set of the LLR values for one symbol will be referred to as a 'message vector'.

The message vector will now be described with reference to a parity check matrix of a non-binary LDPC code. A parity check matrix of a non-binary LDPC code is made up of elements in a Galois Field GF(q) (where q is an integer greater than 2), and a value of q and the number of elements in the GF may be determined depending on the data modulation format. For example, in the case of QPSK modulation, GF is GF(q=4), the number of elements in the GF is 4, and the elements are $\{0, 1, \alpha, \alpha^2\}$. In other words, QPSK modulation may be expressed as GF(4)=$\{0, 1, \alpha, \alpha^2\}$. As another example, in the case of 64-ary Quadrature Amplitude Modulation (64QAM) modulation, q=64, and in this case, 64QAM modulation may be expressed as GF(64)=$\{0, 1, \alpha, \ldots, \alpha^{62}\}$.

It is shown in FIG. 2 that a length of a codeword is assumed to be N, and a message vector for N received symbols is output from the receiving unit 101 and then, input to the variable node processor 201 in the non-binary LDPC decoder 103. In FIG. 2, the modulation format is assumed to be QPSK, so a message vector for a first received symbol #1 includes $\{LLR[0], LLR[1], LLR[\alpha], LLR[\alpha^2]\}$. The element LLR[0] in the message vector for the symbol #1 means that the possibility or probability that a value of the received symbol #1 will be '0'. Similarly, the element LLR[1] means that the possibility or probability that a value of the received symbol #1 will be '1'; the element LLR[$\alpha$] means that the possibility or probability that a value of the received symbol #1 will be '$\alpha$'; and the element LLR[$\alpha^2$] means the possibility or probability that a value of the received symbol #1 will be '$\alpha^2$'. In the same way, each of message vectors for other received symbols #2~#N may also include $\{LLR[0], LLR[1], LLR[\alpha], LLR[\alpha^2]\}$, which have the same meaning as described above.

An operation of the non-binary LDPC decoder 103 will be described in brief, focusing on a relationship between the output of the variable node processor 201 and a parity check matrix H of a non-binary LDPC code.

First, supposing a parity check matrix H of a non-binary LDPC code predetermined to be used for encoding and decoding of data, a row of the matrix is called a check node, and will be represented by 'C', and a column of the matrix is called a variable node, and will be represented by 'V'. If a length of the codeword is N, a length of the variable node is the same as the length N of the codeword, and a length of the check node is the same as a length of a parity. Therefore, the length of the check node may vary depending on the code rate.

Table 7 below shows an example of a parity check matrix H of an arbitrary LDPC code, in which it is assumed that the matrix has N variable nodes and K check nodes.

TABLE 7

|    | V1 | V2 | V3 | V4 | ... | VN |
|----|----|----|----|----|-----|----|
| C1 | 1  | α  | A  | α² | 0   | 0  |
| C2 | A  | 0  | A  | 1  | 0   | A  |
| C3 | 1  | α² | 0  | 1  | 0   | α² |
| ... |   |    |    |    |     |    |
| CK | 0  | 0  | A  | 1  | 0   | α  |

In the parity check matrix H in Table 7, V1~VN represent N variable nodes, and C1~CK represent K check nodes. Supposing the parity check matrix in Table 7, the output of the variable node processor 201 in FIG. 2 may be an input value corresponding to the columns (e.g., variable nodes) in which elements of each row of each parity check matrix have a non-zero value.

For example, after N message vectors are input to the variable node processor 201 as shown in FIG. 2, if first iterative decoding is performed thereon, the output of the variable node processor 201 may be as follows.

In a first row C1 of the matrix H, columns having a non-zero value are V1, V2, V3 and V4. Therefore, an output of the variable node processor 201 for the first row C1 may be message vectors 1, 2, 3 and 4, which are input values corresponding to the variable nodes V1, V2, V3 and V4 having a non-zero value. An output of the variable node processor 201 for a second row C2 of the matrix H may be message vectors 1, 3, 4 and N, which are input values corresponding to the variable nodes V1, V3, V4 and VN having a non-zero value. Outputs of the variable node processor 201 for the other rows may also be determined in the same way.

If the output of the variable node processor 201 is determined in the first iterative decoding in this way, the vector selector 203 may select vector elements from the output message vectors of the variable node processor 201 depending on the T value, and provide the selected vector elements to the check node processor 205, in accordance with an embodiment of the present disclosure. As to the output of the check node processor 205, like the output of the variable node processor 201, the check node processor 205 may output values of rows having a non-zero value in each column of the parity check matrix H, and provide the output values to the variable node processor 201.

In second iterative decoding, a sum of the N message vectors and the outputs of the check node processor 205 may be input to the variable node processor 201, and the output of the variable node processor 201 may be determined as described above. The subsequent processes are the same as the first iterative decoding, so a description thereof will be omitted. For reference, the iterative decoding may last until its iteration reaches the maximum iteration determined by the controller 107.

FIG. 3 illustrates an internal operation of a non-binary LDPC decoder 103 that has determined the number of vector elements to be used for decoding according to an embodiment of the present disclosure.

It will be assumed in FIG. 3 that supposing GF(4)=$\{0, 1, \alpha, \alpha^2\}$ based on the QPSK modulation like in the structure of FIG. 2, and N message vectors are input to the variable node processor 201 on the assumption that a length of a codeword is N. It will be assumed that the controller 107 determines T as 2 (T=2), taking into account the data characteristics, the channel characteristics, the power state of the receiver, the maximum iteration of the non-binary LDPC decoder 103, and the like according to an embodiment of the present disclosure.

In this embodiment, it is assumed that a high-reliability vector element in the output of the variable node processor 201 is set to a large value. The output of the variable node processor 201 may be called a variable node output message. For reference, for the convenience of the system implementation, a high-reliability vector element in a variable node output message may be set to a large value, and on the contrary, a high-reliability vector element may be set to a small value. An embodiment of the latter will be described with reference to FIG. 4.

The variable node processor 201 may output a variable node output message in the way described in FIG. 2 from the non-binary parity check matrix configured using the input message vectors. In FIG. 3, a variable node output message for an arbitrary row of a parity check matrix is assumed as input message vectors corresponding to V1 and V2.

The vector selector 203 may select and output T (=2) elements having a large value from each vector constituting the variable node output message according to the T value (=2) provided from the controller 107. The outputs are represented by reference numerals 307 and 309. Since two high-reliability symbols in a variable node output message V1 are 'α' and '1', the vector selector 203 has selected values 7 and 5 corresponding to 'α' and '1' from the variable node output message V1 (see 307), and since two high-reliability symbols in a variable node output message V2 are '$α^2$' and 'α', the vector selector 203 has selected values 6 and 4 corresponding to '$α^2$' and 'α' from the variable node output message V2 (see 309).

The selected vector element values 307 and 309 may be input to the check node processor 205. The check node processor 205 may generate a check node output message using the vector elements 307 and 309 selected by the vector selector 203, and provide the check node output message to the variable noted processor 201. The way in which the check node processor 205 generates a check node output message is similar to the way in which the variable node processor 201 generates a variable node output message as described in FIG. 2, so a detailed description thereof will be omitted.

In an embodiment of the present disclosure, the reason why the vector selector 203 selects some of the elements of vectors constituting a variable node output message is as follows. In the absence of the vector selector 203, all vector elements of a variable node output message will be input to the check node processor 205 at all times. However, in accordance with an embodiment of the present disclosure, since the controller 107 has already determined the number T of vector elements to be used for decoding by the non-binary LDPC decoder 103, taking into account the data characteristics, the channel characteristics, the power state of the receiver, the maximum iteration of the non-binary LDPC decoder 103, and the like, if the non-binary LDPC decoder 103 performs decoding using the vector elements selected based on the determined T value, the number of vector elements being input to the check node processor 205 may decrease, contributing to the minimization of computation.

FIG. 4 illustrates an internal operation of a non-binary LDPC decoder 103 that has determined the number of vector elements to be used for decoding according to another embodiment of the present disclosure.

It will be assumed in FIG. 4 that GF(4)={0, 1, α, $α^2$} based on the QPSK modulation like in the structure of FIG. 3. Similarly, it will be assumed that the controller 107 determines T as 2 (T=2). However, in this embodiment, it will be assumed that unlike in FIG. 3, a high-reliability vector element in a variable node output message is set to a small value.

An output of the variable node processor 201 is the same as described in FIG. 3. In other words, the variable node processor 201 may output a variable node output message in the way described in FIG. 2 from a non-binary parity check matrix configured using input message vector elements. In FIG. 4, a variable node output message for an arbitrary row of a parity check matrix is assumed as input message vectors corresponding to V1 and V2.

However, the output of the vector selector 203 is different from that in FIG. 3. Since FIG. 4 shows an embodiment in which unlike in FIG. 3, a high-reliability vector element in the variable node output message is set to a small value, the output of the vector selector 203 may be different from the output in FIG. 3. In other words, since two high-reliability symbols in a variable node output message V1 are '0' and '1', the vector selector 203 has selected values −1 and 2 corresponding to '0' and '1' from the variable node output message V1 (see 407), and since two high-reliability symbols in a variable node output message V2 are '$α^2$' and '0', the vector selector 203 has selected values 2 and 3 corresponding to '$α^2$' and '0' from the variable node output message V2 (see 409). The selected vector element values 407 and 409 may be input to the check node processor 205. The check node processor 205 may generate a check node output message using the vector elements 407 and 409 selected by the vector selector 203, and provide the check node output message to the variable noted processor 201. The way in which the check node processor 205 generates a check node output message is similar to the way in which the variable node processor 201 generates a variable node output message as described in FIG. 2, so a detailed description thereof will be omitted.

FIG. 5 illustrates an internal operation of a non-binary LDPC decoder 103 that has determined the number of vector elements to be used for decoding according to further another embodiment of the present disclosure.

It will be assumed in FIG. 5 that GF(4)={0, 1, α, $α^2$} based on the QPSK modulation like in the structure of FIGS. 3 and 4. However, in FIG. 5, a value of T is assumed to be 6. In the embodiment of FIG. 5, unlike in the embodiments of FIGS. 3 and 4, T vector elements may be selected from the elements constituting vectors of all variable nodes. In the embodiments of FIGS. 3 and 4, when selecting T vector elements, the vector selector 203 has selected two elements from the vector of V1, and two elements from the vector of V2. On the other hand, in the embodiment of FIG. 5, the vector selector 203 may select T elements from the elements constituting message vectors for all variable nodes.

In FIG. 5, a variable node output message is assumed as input message vectors corresponding to V1, V2, V3 and V4. In the embodiment of FIG. 5, since the vector selector 203 is set to select T elements from vector elements of vectors of all variable node output messages, the vector selector 203 may select 6 elements having a large value from among all elements of vectors of V1, V2, V3 and V4. Therefore, it can be seen that 8 and 5 are selected from V4; 6 is selected from each of V3 and V2; and 5 and 7 are selected from V1.

FIG. 6 illustrates an operation of receiving and decoding data and performing an HARQ operation depending on the decoding results by a receiver according to embodiments of the present disclosure.

In operation 601, the receiver may receive a data packet transmitted by a transmitter, and demodulate the received data packet.

In operation 603, the receiver may obtain, from the demodulated packet data, received-data characteristics (e.g., data packet size, modulation format, code rate, etc.) and channel characteristics (e.g., SINR, CQI, etc.). In addition, the receiver may determine the current power state of the receiver.

In operation 605, the receiver may determine the number T of vector elements to be used for decoding and the maximum iteration for iterative decoding, taking into account at least one of the data characteristics, the channel characteristics and the current power state of the receiver, which are determined in operation 603. The receiver may consider the determined T value when determining the maximum iteration, or may consider the determined maximum iteration when determining the T value.

The receiver may decode a data packet depending on the determined T value and maximum iteration in operation 607, and check whether there is an error in the decoded data, in operation 609. If there is no error, the receiver may send an ACK in operation 611, determining that the decoding is successful. If there is an error, the receiver may proceed to operation 613, determining that the decoding is failed.

In operation 613, the receiver may compare the current T value with the Tmax value. If the T value does not exceed the Tmax value, the receiver may increase T in operation 617 in order to increase the number of vector elements and perform decoding again. Although the receiver usually increases T one by one, the receiver may increase T on an N-by-N basis where N is a value greater than 1, depending on the setting. Thereafter, in operation 605, the receiver may determine the T value again depending on the increased T value. In this case, the receiver may newly determine the maximum iteration. However, unless otherwise specified, the previously determined maximum iteration may be used as it is.

If the T value has exceeded the Tmax value in operation 613, the receiver may send a NACK in operation 615, determining that the decoding of the received data is finally failed.

So far, a description has been given of embodiments in which the vector selector 203 selects T vector elements from a variable node output message which is an output of the variable node processor 201. However, in an alternative embodiment of the present disclosure, multiple vector selectors 203 may be provided.

FIG. 7 illustrates a structure of a receiver according to another embodiment of the present disclosure.

Among the components in FIG. 7, only the components different from those in FIG. 1 will be described.

In FIG. 7, three vector selectors 203 are illustrated. In other words, the three vector selectors 203 include a first vector selector 203-1 between the receiving unit 101 and the variable node processor 201 in the non-binary LDPC decoder 103, a second vector selector 203-2 situated in the same location as in the embodiments described in FIGS. 2 to 5, and a third vector selector 203-3 located between the check node processor 205 and the variable node processor 201.

The vector selectors 203-1 to 203-3 are different in location, but are the same in the function. In other words, the first vector selector 203-1 may select T1 vector elements from the message vector which is an output of the receiving unit 101, and the second vector selector 203-2 may select T2 vector elements from a vector of a variable node output message which is an output of the variable node processor 201, as described above. The third vector selector 203-3 may select T3 vector elements from a vector of a check node output message which is an output of the check node processor 205. As for T1, T2 and T3, as described in the above embodiments, the controller 107 may determine T1, T2 and T3, taking into account at least one of the received-data characteristics, the channel characteristics, the power state of the receiver, and the maximum iteration of the non-binary LDPC decoder 103.

So far, a description has been given of embodiments in which the controller 107 determines the T value for every received data, taking into account the data characteristics, the channel characteristics, the power state of the receiver, the maximum iteration, and the like. In another alternative embodiment, the T value may be set in advance. For example, the receiver may receive a reference signal from the transmitter, and determine a CQI indicating a channel state, using the received reference signal, and if the determined CQI, and the modulation format and code rate for transmission/reception data are given, the receiver may determine the T value according thereto. Table 8 below shows an example of a table in which a T value is determined in advance depending on the CQI, modulation format and code rate.

TABLE 8

| CQI index | Modulation | Approximate code rate | T value |
|---|---|---|---|
| 0 | No transmission | | |
| 1 | QPSK | 0.076 | 4 |
| 2 | QPSK | 0.12 | 4 |
| 3 | QPSK | 0.19 | 3 |
| 4 | QPSK | 0.3 | 3 |
| 5 | QPSK | 0.44 | 2 |
| 6 | QPSK | 0.59 | 2 |
| 7 | 16 QAM | 0.37 | 12 |
| 8 | 16 QAM | 0.48 | 8 |
| 9 | 16 QAM | 0.6 | 4 |
| 10 | 64 QAM | 0.45 | 32 |
| 11 | 64 QAM | 0.55 | 32 |
| 12 | 64 QAM | 0.65 | 16 |
| 13 | 64 QAM | 0.75 | 16 |
| 14 | 64 QAM | 0.85 | 8 |
| 15 | 64 QAM | 0.93 | 8 |

FIG. 8 illustrates the number T of vector elements, which is determined depending on the packet size, which is an example of received-data characteristics, according to embodiments of the present disclosure.

It can be seen in FIG. 8 that at the same error correction target value, as the packet size is larger, the T value is smaller, which means a decrease in the number of vector elements required during the decoding. Therefore, the computation required in the decoding process may decrease.

FIG. 9 illustrates a relationship between the determined number T of vector elements and the computation required during decoding according to embodiments of the present disclosure. It can be seen in FIG. 9 that as T is greater, the computation during decoding is greater. Therefore, if T is set to be small even at the maximum decoding performance according to embodiments of the present disclosure, the power efficiency and decoding time of the receiver may be improved.

FIG. 10 illustrates a relationship between a Signal to Noise Ratio (SNR), which is an example of channel characteristics, and the number T of vector elements according to an embodiment of the present disclosure.

It can be seen in FIG. 10 that as the SNR is higher, the T value is smaller. It can be noted that a T value corresponding to the SNR varies depending on the iteration value (100 and 35 in FIG. 10).

FIG. 11 illustrates a relationship between a Frame Error Rate (FER) and an SNR for the changing number T of vector elements according to an embodiment of the present disclosure.

It can be seen in FIG. 11 that the T value can be changed to 32 (1101), 16 (1103), 12 (1105), and 8 (1107). In this case, for example, supposing the packet size of 720 bits, code rate of ⅓ and maximum iteration of 35, which are given in FIG. 11, a T value of up to 8 can be used. In the existing decoding scheme, the T value is fixed to 32, for decoding. If T is determined as 8 according to an embodiment of the present disclosure, the computation may be reduced to a maximum of ¼ of that of the existing scheme, contributing to a decrease in the power consumption and decoding time of the decoder.

FIG. 12 illustrates a relationship between an FER and an SNR for the changing number T of vector elements at a constant iteration according to an embodiment of the present disclosure.

In FIG. 12, the iteration is set to 35, the packet size is set to 960 bits, and the code rate is set to ⅓. In this case, T of up to 16 can be selected. Decoding computation for T=16 may be reduced to a maximum of ½ of decoding computation for T=32, which is fixed in the existing scheme, contributing to a decrease in the power consumption and decoding time of the decoder.

As is apparent from the foregoing description, according to various embodiments of the present disclosure, a receiver that performs decoding using a non-binary LDPC code can select message vector elements to be used for decoding, taking into account the data characteristics and channel conditions for received data, the power state of the receiver, and the iteration for iterative decoding, and can perform decoding using the selected vector elements, thereby contributing to a reduction in the time and power consumption required during decoding.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

The invention claimed is:

1. A method for receiving data in a receiver that performs decoding using a non-binary low density parity check (LDPC) code, the method comprising:
    generating a message vector for each symbol by demodulating received data;
    determining data characteristics and channel characteristics of the received data;
    determining a number of vector elements to be used for decoding among vector elements of the message vector using at least one of the data characteristics and the channel characteristics;
    selecting vector elements according to the determined number of vector elements; and
    decoding the received data using the selected vector elements,
    wherein the message vector refers to a set of possibility for symbol values of the each symbol.

2. The method of claim 1, wherein determining the number of vector elements comprises:
    determining a maximum iteration using at least one of the data characteristics and the channel characteristics;
    determining a power state of the receiver; and
    determining the number of vector elements using at least one of the data characteristics, the channel characteristics, the maximum iteration, and the power state of the receiver.

3. The method of claim 1, further comprising:
    increasing the determined number of vector elements by a predetermined value, if there is an error in the decoded data and the determined number of vector elements is less than a predetermined threshold; and
    reselecting the vector elements according to the increased number of vector elements and decoding the received data using the reselected vector elements.

4. The method of claim 1, further comprising:
    if there is an error in the decoded data and the determined number of vector elements is greater than or equal to a predetermined threshold, generating a decoding fail signal for errored data; and
    generating and sending a negative acknowledgement (NACK) message for the errored data.

5. The method of claim 1, wherein selecting the vector elements comprises selecting the determined number of vector elements from among the vector elements of the message vector for each of the symbols.

6. The method of claim 1, wherein selecting the vector elements comprises selecting the determined number of vector elements from all vector elements of message vectors for N symbols constituting a codeword.

7. The method of claim 1, wherein determining the number of vector elements comprises determining the number of vector elements for a variable node output message while performing decoding using the LDPC code; and
    wherein selecting the vector elements comprises selecting the determined number of vector elements for the variable node output message from among vector elements of the variable node output message.

8. The method of claim 1, wherein determining the number of vector elements comprises determining the number of vector elements for a check node output message while performing decoding using the LDPC code; and
    wherein selecting the vector elements comprises selecting the determined number of vector elements for the check node output message from among vector elements of the check node output message.

9. The method of claim 1, wherein the data characteristics include at least one of a packet size, a modulation format, and a code rate of the received data.

10. The method of claim 1, wherein the channel characteristics include at least one of a signal-to-interference plus noise ratio (SINR) and a channel quality indicator (CQI).

11. An apparatus for receiving data in a receiver that performs decoding using a non-binary low density parity check (LDPC) code, the apparatus comprising:
    a receiver configured to generate a message vector for each symbol by demodulating received data;
    a controller configured to:
        determine data characteristics and channel characteristics of the received data, and
        determine a number of vector elements to be used for decoding among vector elements of the message vector using at least one of the data characteristics and the channel characteristics;
    a vector selector configured to select vector elements according to the determined number of vector elements; and
    a decoder configured to decode the received data using the selected vector elements,
    wherein the message vector refers to a set of possibility for symbol values of the each symbol.

12. The apparatus of claim 11, wherein the controller is configured to:
    determine a maximum iteration using at least one of the data characteristics and the channel characteristics;
    determine a power state of the receiver; and
    determine the number of vector elements using at least one of the data characteristics, the channel characteristics, the maximum iteration, and the power state of the receiver.

13. The apparatus of claim 11, wherein the controller is further configured to increase the determined number of vector elements by a predetermined value, if there is an error in the decoded data and the determined number of vector elements is less than a predetermined threshold;
    wherein the vector selector is further configured to reselect the vector elements according to the increased number of vector elements; and
    wherein the decoder is further configured to decode the received data using the reselected vector elements.

14. The apparatus of claim 11, wherein if there is an error in the decoded data and the determined number of vector elements is greater than or equal to a predetermined threshold, the controller generates a decoding fail signal for errored data; and wherein the receiver includes an HARQ processor configured to generate a negative acknowledgement (NACK) message for the errored data, and to send the NACK message through a transmitting unit.

15. The apparatus of claim 11, wherein the vector selector is configured to select the determined number of vector elements from among the vector elements of the message vector for each of the symbols.

16. The apparatus of claim 11, wherein the vector selector is configured to select the determined number of vector elements from all vector elements of message vectors for N symbols constituting a codeword.

17. The apparatus of claim 11, wherein the controller is further configured to determine the number of vector elements for a variable node output message which is an output of a variable node processor in the decoder that decodes using the LDPC code; and wherein the vector selector is further configured to select the determined number of vector elements for the variable node output message from among vector elements of the variable node output message.

18. The apparatus of claim 11, wherein the controller is further configured to determine the number of vector elements for a check node output message which is an output message of a check node processor in the decoder that performs decoding using the LDPC code; and wherein the vector selector is further configured to select the determined number of vector elements for the check node output message from among vector elements of the check node output message.

19. The apparatus of claim 11, wherein the data characteristics include at least one of a packet size, a modulation format, and a code rate of the received data.

20. The apparatus of claim 11, wherein the channel characteristics include at least one of a signal-to-interference plus noise ratio (SINR) and a channel quality indicator (CQI).

* * * * *